United States Patent [19]
Chang

[11] Patent Number: 5,920,499
[45] Date of Patent: *Jul. 6, 1999

[54] METHOD OF DECODING A DIODE TYPE READ ONLY MEMORY

[75] Inventor: Kuang-Yeh Chang, Taipei City, Taiwan

[73] Assignee: United Microelectronics Corp., Taiwan

[ * ] Notice: This patent is subject to a terminal disclaimer.

[21] Appl. No.: 08/969,151

[22] Filed: Nov. 12, 1997

Related U.S. Application Data

[63] Continuation-in-part of application No. 08/778,741, Jan. 2, 1997, abandoned.

[51] Int. Cl.⁶ .................................................. G11C 17/06

[52] U.S. Cl. .............................. 365/105; 365/94; 365/175

[58] Field of Search .............................. 365/105, 94, 175; 257/46, 104, 212

[56] References Cited

U.S. PATENT DOCUMENTS

| | | | |
|---|---|---|---|
| 4,598,386 | 7/1986 | Roesner et al. | 365/105 |
| 4,608,672 | 8/1986 | Roberts et al. | 365/105 |
| 4,646,266 | 2/1987 | Ovshinsky et al. | 365/105 |
| 4,679,085 | 7/1987 | Johnson et al. | 365/105 |
| 4,800,529 | 1/1989 | Ueno | 365/105 |
| 5,646,879 | 7/1997 | Harshfield | 365/105 |
| 5,737,239 | 4/1998 | Chang | 365/105 |

*Primary Examiner*—Vu A. Le
*Attorney, Agent, or Firm*—Rabin & Champagne, P.C.

[57] ABSTRACT

A diode type read only memory (ROM) includes a diode as a memory cell. The diode is a logic level "on" memory cell and coupled to one of the word lines and one of the bit lines of the ROM. A relative high voltage is given to the bit line coupled to the diode and a relative high voltage is given to the corresponding word line. Therefore, the data saved in the diode can be read out.

11 Claims, 3 Drawing Sheets

METHOD OF DECODING A DIODE TYPE READ ONLY MEMORY

CROSS-REFERENCE TO RELATED APPLICATIONS

The present application is a Continuation-in-Part of U.S. patent application Ser. No. 08/778,741, filed Jan. 2, 1997, now abandoned, the rights of priority of which are claimed pursuant to 35 U.S.C. §120.

BACKGROUND OF THE INVENTION

1. Field of the Invention

The invention relates in general to a decoding method of a read only memory (ROM), and more particularly to a decoding method of a diode-type ROM array.

2. Description of the Related Art

ROM has been widely applied in digital instruments, such as mini-computer and micro-processor. ROM is used for saving data, such as basic input output system (BIOS), which is not desired to be erased even though the power supply is stopped.

The commonly used ROM uses channel transistors as memory cells. In a process step of programming, dopants are selectively implanted into a certain channel region to adjust the threshold voltage to control the memory cell to be either on or off. FIG. 1 is a top view of a portion of a conventional ROM structure. Polysilicon word lines WL10 are formed over bit lines BL12. The channel regions 14 are the regions under word lines WL10 and between the bit lines BL12. Binary data, 0 or 1, saved in each memory cell is dependent on whether ions are implanted into the channel region 14 or not.

FIG. 2 is the equivalent circuit diagram of a conventional ROM 20. ROM 20 includes a number of word lines WLs which are aligned as parallel arrays and a number of bit lines BLs which are also aligned as parallel arrays. Saving data is accomplished by the combination of different threshold voltages of different memory cells. Logical level "on" or "0" is saved in a transistor 22, which is located in the intersection of bit lines BL2, BL3 and word line WL2, forming a relative low threshold voltage. Logical level "off" or "1" is saved in a transistor 24, which is located in the crossing site of bit lines BL3, BL4 and word line WL1, forming a relative high threshold voltage. By measuring the output current of the memory cell, the data saved in the memory cell can be read out, after a certain potential is given to relative bit lines and a word line of a memory cell. A memory cell 22, which is a transistor having a relative low threshold voltage, is taken as an example. The word line WL2 and the bit line BL2, which are both connected to the transistor 22, are both given a high voltage. A low voltage is given to the bit line BL3. Since the transistor 22 has a relative low threshold voltage and is therefore "on", current flows from bit line BL2 through transistor 22 to bit line BL3, as arrow 25 shows. Therefore, current signal can be detected in bit line BL2 and the data saved can be read out as "0" or "on". To make sure that the current will not flow to the bit line BL1, if the adjacent memory cell 26 also has a relative low threshold voltage, a relative high voltage is given to the bit line BL1. The other bit lines, such as BL3 and BL4, are floating. A transistor 24 is taken as an example of a memory cell having a relative high threshold voltage. The word line WL1 and the bit line BL3, which are both connected to the transistor 24, are both given a high voltage. A low voltage is given to the bit line BL4. Since the transistor 24 has a relative high threshold voltage and is therefore "off". Therefore, current signal can not be detected in bit line BL3 and the data saved can be read out as "1" or "off".

For the above-mentioned conventional ROM, two of the bit lines have to be given high voltage and another one of the bit lines has to be given low voltage as decoding in order to prevent reverse current. Since the breakdown voltage of the junction between the bit line and the channel is about 3 voltage, the operating voltage for decoding is limited to be less than 3 voltage, which results in difficulty in reading information. Moreover, the electric resistance of the heavily doped bit line is too high, which is about $100\Omega/\square$ ($\Omega$ per square), to increase the operating current and speed up decoding.

SUMMARY OF THE INVENTION

It is therefore an object of the invention to provide a decoding method for a ROM, especially for a diode type ROM. Using a diode as a memory cell successfully increases the operating current.

It is another object of the invention to provide a decoding method for a diode type ROM. Only one bit line has to be given a certain voltage but without reverse current and floating bit line.

It is another object of the invention to provide a decoding method for a diode type ROM, using a diode as a memory cell. Therefore, the operating voltage can be more than 10 voltage.

The invention achieves the above-identified objects by providing a method of decoding a diode type read only memory. A diode type read only memory (ROM) includes a diode as a memory cell. The diode is a logic level "on" memory cell and coupled to one of the word lines and one of the bit lines of the ROM. A relative high voltage is given to the bit line coupled to the diode and a relative high voltage is given to the corresponding word line. Therefore, the data saved in the diode can be read out.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
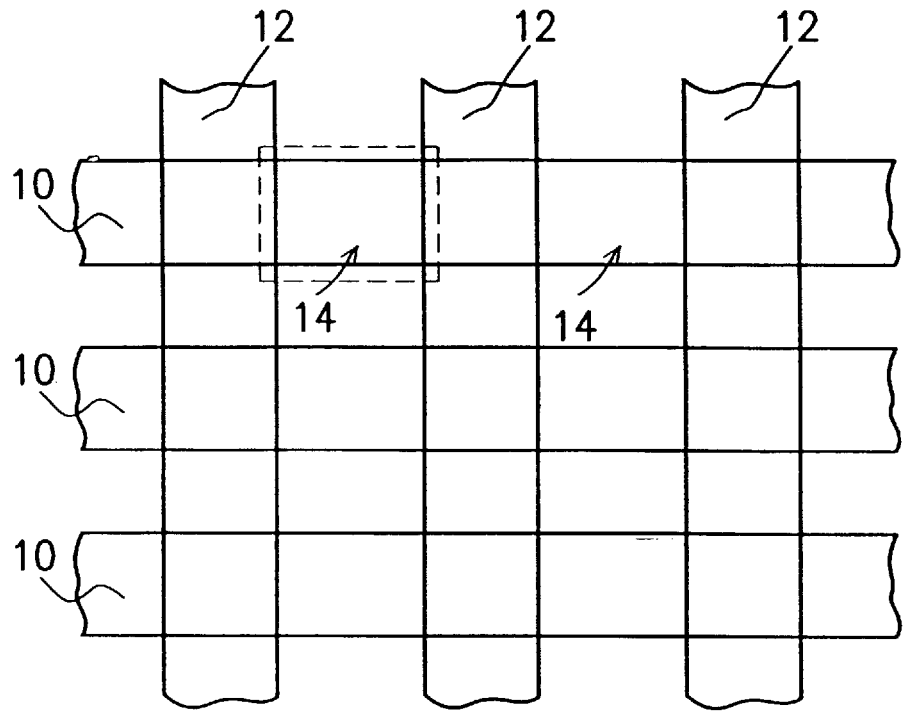
FIG. 1 is a top view of a potion of the conventional ROM.
Figure 2:
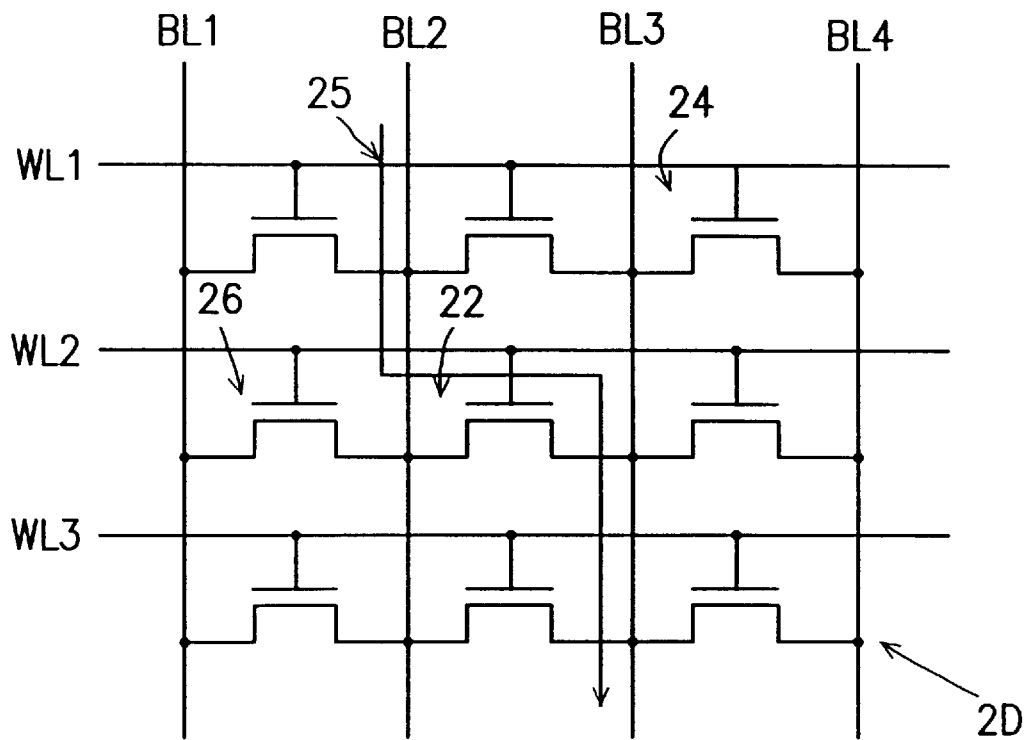
FIG. 2 is an equivalent circuit diagram of a potion of the conventional ROM.
Figure 3:
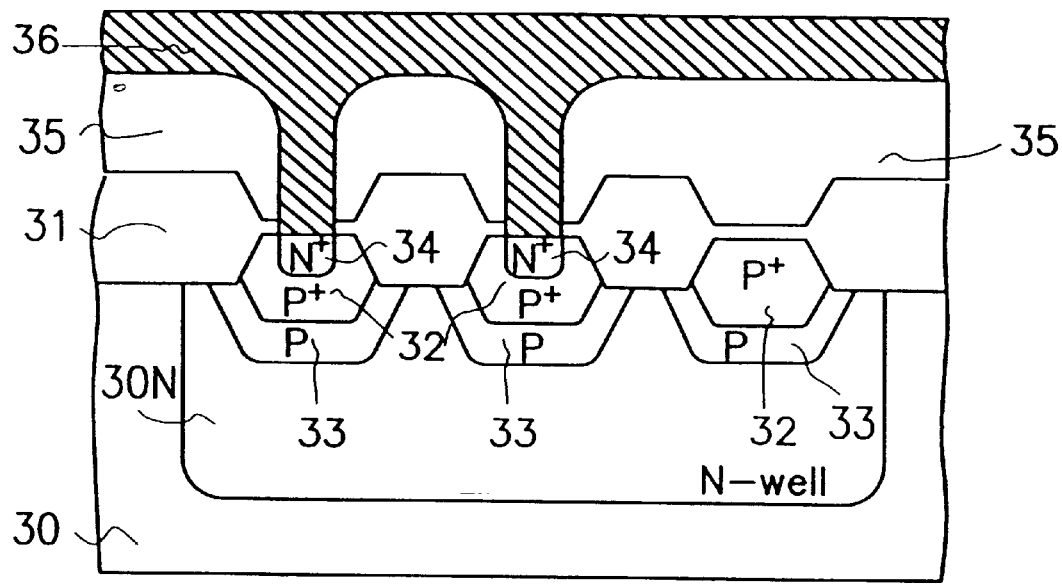
FIG. 3 is a cross-sectional view of a diode type ROM in accordance with a preferred embodiment of the invention.

Referring to FIG. 3, a number of substantially parallel heavily P-type ion doped diffusion regions 32 are formed in a N-well 30N of a P-type substrate 30. These heavily P-type ion doped diffusion regions 32 are located in active regions surrounded by field oxide layers 31 and are used as bit lines of a ROM. Lightly P-type ion doped diffusion regions 33 are formed below the heavily P-type ion doped diffusion regions 32. Heavily N-type ion doped diffusion regions 34 are formed in some of the heavily P-type ion doped diffusion regions 32. The heavily P-type ion doped diffusion regions 32 and the heavily N-type ion doped diffusion regions 34 therefore form a number of PN diodes. An insulating layer 35 is formed over the substrate 30. A number of substantially parallel metal lines 36 are formed on and through the insulating layer 35 to be coupled to the heavily N-type ion doped diffusion regions. The metal lines 36 are used as word lines and are substantially orthogonal to the bit lines, the heavily P-type ion doped diffusion regions 32.

Figure 4:
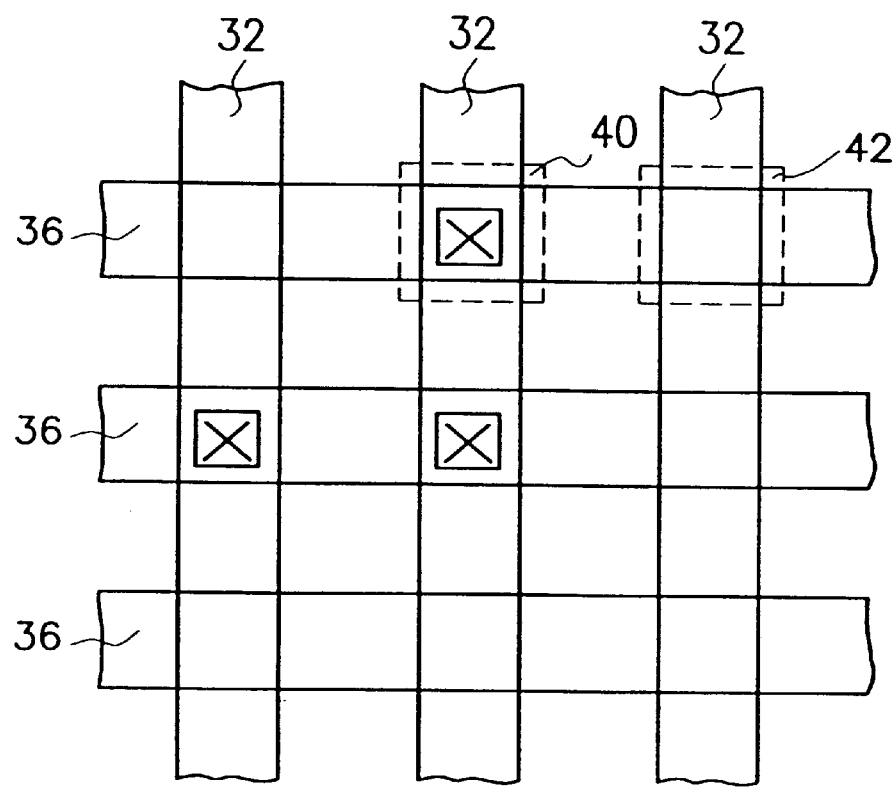
FIG. 4 is a top view of a potion of the diode type ROM in accordance with a preferred embodiment of the invention.

Referring to FIG. 4, the crossing site of one of the bit lines 32 and on the word lines 36 is a memory cell, for example, the region 40 and the region 42 surrounded by dot lines. The memory cell 40 including a N-type ion doped diffusion region (symbolized by an "X" sign) besides a P-type ion doped diffusion region forms a diode. Therefore, the memory cell 40 is "on". On the other hand, the memory cell 42 without a N-type ion doped diffusion region is "off".

Figure 5:
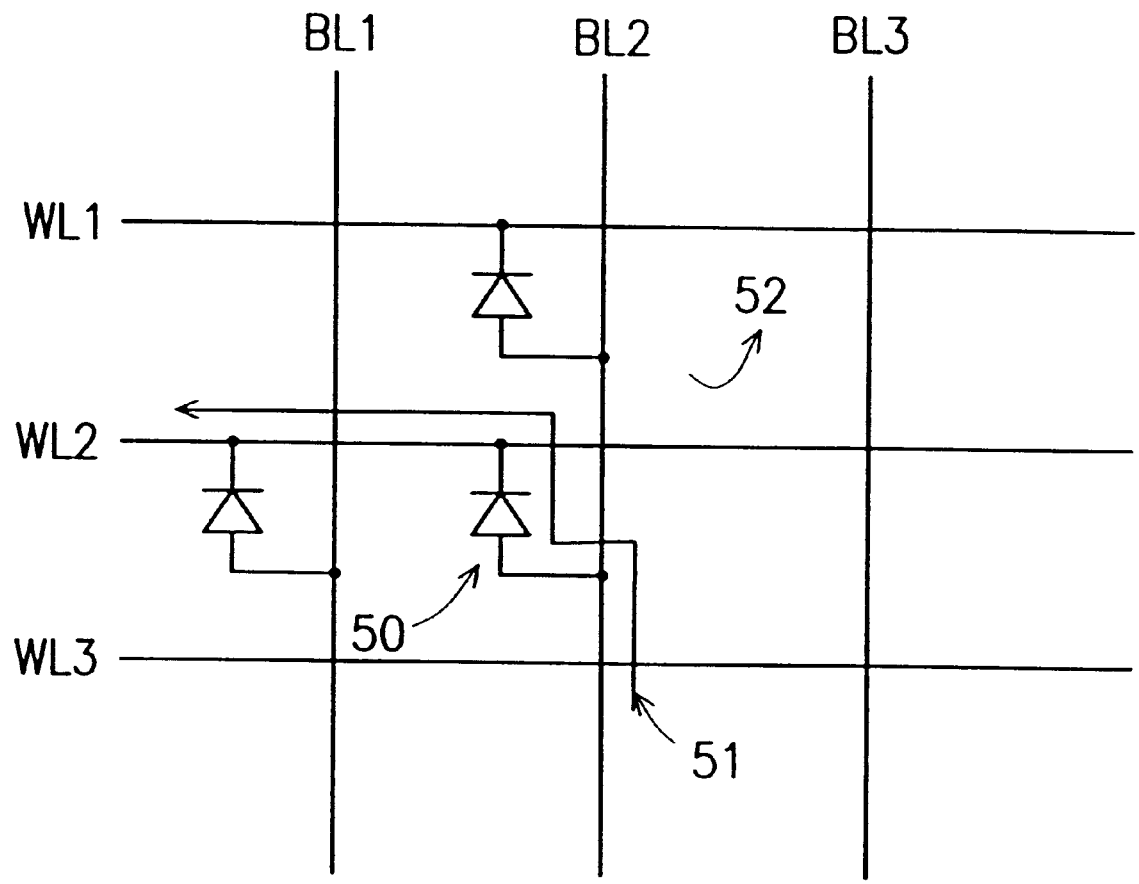
FIG. 5 is an equivalent circuit diagram of a portion of the diode type ROM in accordance with a preferred embodiment of the invention.

Referring to FIG. 5, a memory cell 50, which is a diode, is selected to be read. A relative low voltage, such as 0 volt, is given to a word line WL2. The WL2 is coupled to the memory cell 50. A relative high voltage, such as 5 volt, is given to a bit line BL2. The BL2 is coupled to the memory cell 50. The other word lines are given a relative high voltage like 5 volt and the other bit lines are given a relative low voltage like 0 volt. Therefore, current flows from the bit line BL2 through the memory cell 50 to the word line WL2 as the arrow 51 shows. Thus, the data saved in the memory cell 50 can be read out as logical level "1" or "on".

If on the other hand a "off" memory cell 52 is selected to be read, a relative low voltage, such as 0 volt, is given to a word line WL1. The WL1 is coupled to the memory cell 52. A relative high voltage, such as 5 volt, is given to a bit line BL3. The BL3 is coupled to the memory cell 52. The other word lines are given a relative high voltage like 5 volt and the other bit lines are given a relative low voltage like 0 volt. Therefore, current will not be able to flow from the word line WL1. Thus, the data saved in the memory cell 52 can be read out as logical level "0" or "off".

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of decoding a diode type read only memory, including:

forming a read only memory comprising at least a first memory cell and at least a second memory cell, wherein the first memory cell is a diode comprised of a first conductivity type diffusion region formed in contact with a second conductivity type diffusion region, the first memory cell being coupled to a first bit line and a corresponding first word line, and the second memory cell has a logic data "off" and is comprised of a second conductivity type diffusion region and is free of a first conductivity type diffusion region, the second memory cell being coupled to a second bit line and a corresponding second word line;

providing a first voltage to one of the first bit line and the second bit line; and providing a second voltage to the first word line if the first voltage was applied to the first bit line, and to the second word line if the first voltage was applied to the second bit line, wherein the first voltage is higher than the second voltage so that the first bit line, the first memory cell and the first word line form a closed circuit.

2. A method as claimed claim 1, wherein the first conductivity type diffusion region of the first memory cell comprises a N-type dopant diffusion region coupled to the first word line, and the second conductivity type diffusion region of the first memory cell comprises a P-type dopant diffusion region coupled to the first bit line.

3. A method as claimed in claim 1, wherein the second conductivity type diffusion region of the second memory cell comprises a P-type dopant diffusion region coupled to the second bit line.

4. A method as claimed in claim 1, wherein the first word line is the second word line, and the first bit line is not the second bit line.

5. A method as claimed in claim 1, wherein the first bit line is the second bit line, and the first word line is not the second word line.

6. A method of decoding a diode type read only memory, the read only memory comprising at least a first did at a least a second memory cell, wherein the first memory cell is a diode and is coupled to a first bit line and a corresponding first word line, and the second memory cell has a logic data "off" and is coupled to a second bit line and a corresponding second word line; wherein the method comprises:

providing a first voltage to one of the first bit line and the second bit line; and providing a second voltage to one of the first word line and the second word line which is corresponding to one of the first bit line and the second bit line provided with the first voltage, wherein the first voltage is 5 volts and the second voltage is 0 volts, so that tile first bit line, the first memory cell and the first word line form a closed circuit.

7. The method of claim 1, wherein the second conductivity type diffusion region of the first memory cell partially encloses the first conductivity type diffusion region.

8. The method of claim 1, wherein the first conductivity type diffusion region is doped N+ and the second conductivity type diffusion regions are doped P+.

9. The method of claim 1, wherein the second bit line, the second memory cell and the second word line do not form a closed circuit.

10. The method of claim 1, wherein the second conductivity type diffusion regions include an upper portion and a lower portion, the upper portion being more heavily doped than the lower portion.

11. The method of claim 10, wherein the first conductivity type diffusion region is doped N+, the upper portion of the second conductivity type diffusion region is doped P+, and the lower portion of the second conductivity region is doped P.

\* \* \* \* \*